(12) United States Patent
Adiga et al.

(10) Patent No.: US 11,189,435 B2
(45) Date of Patent: Nov. 30, 2021

(54) SWITCH DEVICE FACILITATING FREQUENCY SHIFT OF A RESONATOR IN A QUANTUM DEVICE

(71) Applicant: International Business Machines Corporation, Armonk, NY (US)

(72) Inventors: Vivekananda P. Adiga, Ossining, NY (US); Martin O. Sandberg, Ossining, NY (US); Firat Solgun, Ossining, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 75 days.

(21) Appl. No.: 16/709,350

(22) Filed: Dec. 10, 2019

(65) Prior Publication Data
US 2021/0175026 A1 Jun. 10, 2021

(51) Int. Cl.
| | |
|---|---|
| *H01H 1/00* | (2006.01) |
| *G06N 10/00* | (2019.01) |
| *H01L 29/66* | (2006.01) |
| *B82Y 10/00* | (2011.01) |

(52) U.S. Cl.
CPC .......... *H01H 1/0036* (2013.01); *G06N 10/00* (2019.01); *H01L 29/66977* (2013.01); *B82Y 10/00* (2013.01)

(58) Field of Classification Search
CPC  H01H 1/0036; G06N 10/00; H01L 29/66977; B82Y 10/00
See application file for complete search history.

(56) References Cited

U.S. PATENT DOCUMENTS

| | | | |
|---|---|---|---|
| 6,218,911 B1 | 4/2001 | Kong et al. | |
| 7,053,737 B2 | 5/2006 | Schwartz et al. | |
| 7,411,187 B2 | 8/2008 | Monroe et al. | |
| 7,545,236 B2 | 6/2009 | Naito | |
| 7,720,377 B2 | 5/2010 | Snider et al. | |

(Continued)

FOREIGN PATENT DOCUMENTS

CN          101202369          12/2011

OTHER PUBLICATIONS

International Search report and written opinion received for PCT application No. PCT/EP2020/084815 dated Apr. 20, 2021, 13 pages.

(Continued)

*Primary Examiner* — Mohammed R Alam
(74) *Attorney, Agent, or Firm* — Amin, Turocy & Watson, LLP

(57) ABSTRACT

Devices, systems, methods, computer-implemented methods, apparatus, and/or computer program products that can facilitate a switch device that shifts frequency of a resonator in a quantum device are provided. According to an embodiment, a device can comprise a readout resonator coupled to a qubit. The device can further comprise a switch device formed across the readout resonator that shifts frequency of the readout resonator based on position of the switch device. According to another embodiment, a device can comprise a bus resonator coupled to a plurality of qubits. The device can further comprise a switch device formed across the bus resonator that shifts frequency of the bus resonator based on position of the switch device.

20 Claims, 12 Drawing Sheets

(56) References Cited

U.S. PATENT DOCUMENTS

| | | | |
|---|---|---|---|
| 8,063,535 | B2 | 11/2011 | Mohanty et al. |
| 9,928,827 | B1 * | 3/2018 | El-Kady et al. |
| 2017/0076787 | A1 * | 3/2017 | Frank ............... G11C 11/44 |
| 2017/0317262 | A1 | 11/2017 | Abraham et al. |
| 2019/0270635 | A1 | 9/2019 | Painter et al. |

OTHER PUBLICATIONS

Casparis et al., "Voltage-Controlled Superconducting Quantum Bus", Physical Review B 99, DOI: 10.1103/physrevb.99.085434, Feb. 5, 2018, 7 pages.

Pechal et al., "Superconducting switch for fast on-chip routing of quantum microwave fields" Jun. 3, 2016, pp. 1-8.

Ranzani et al., "Two-port microwave calibration at millikelvin temperatures", Review of Scientific Instruments, DOI:10.1063/1.4794910, vol. 84, Mar. 1, 2013, 10 pages.

Rebeiz et al., "RF MEMS Switches and Switch Circuits", IEEE Microwave Magazine, DOI:10.1109/6668.969936, , vol. 2, No. 4,Dec. 1, 2001, pp. 59-71.

Schoenlinner et al., "The low-complexity RF MEMS switch at EADS: An overview", International Journal of Microwave and Wireless Technologies, DOI: 10.1017/S1759078711000729, vol. 3, No. 5, Sep. 30, 2011, pp. 499-508.

Goldsmith et al., "Charging Characteristics of Ultra-Nano-Crystalline Diamond in RF MEMS Capacitive Switches," IEEE MTT-S International Microwave Symposium 2010 DOI:10.1109/mwsym.2010.5518076, Jun. 2010, 4 pages.

Goldsmith et al., "Performance of Low-Loss RF MEMS Capacitive Switches," IEEE Microwave and Guided Wave Letters, vol. 8, No. 8, Aug. 1998, 3 pages.

* cited by examiner

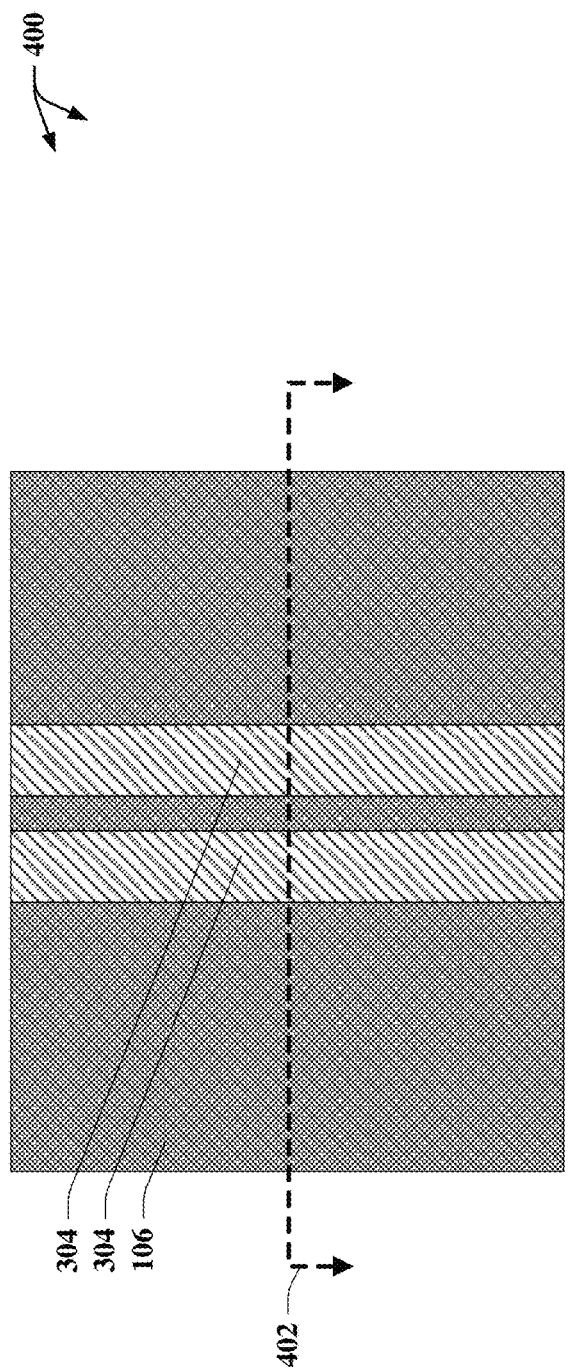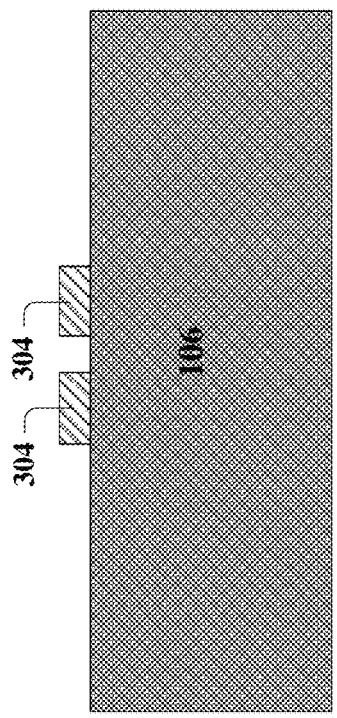
FIG. 4A
FIG. 4B

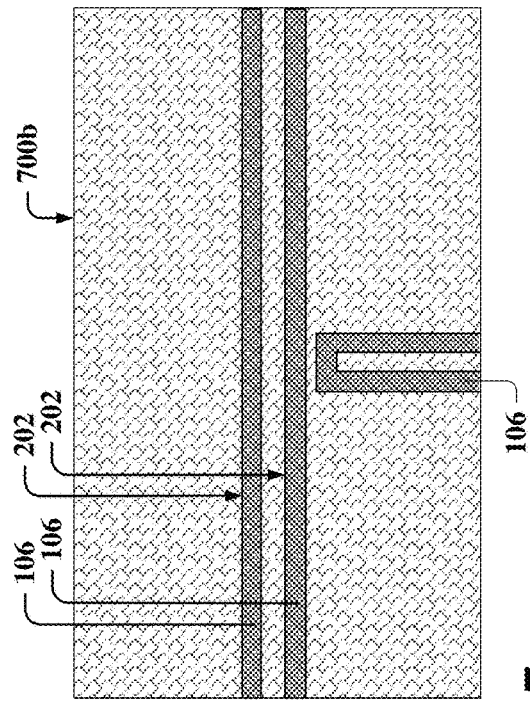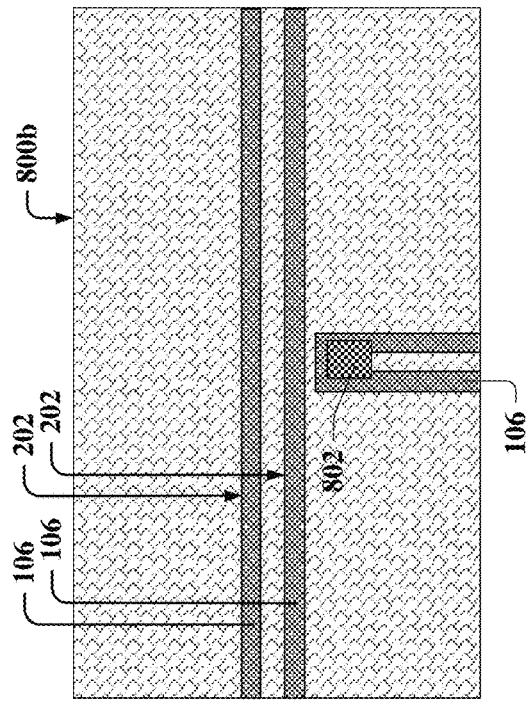
FIG. 7
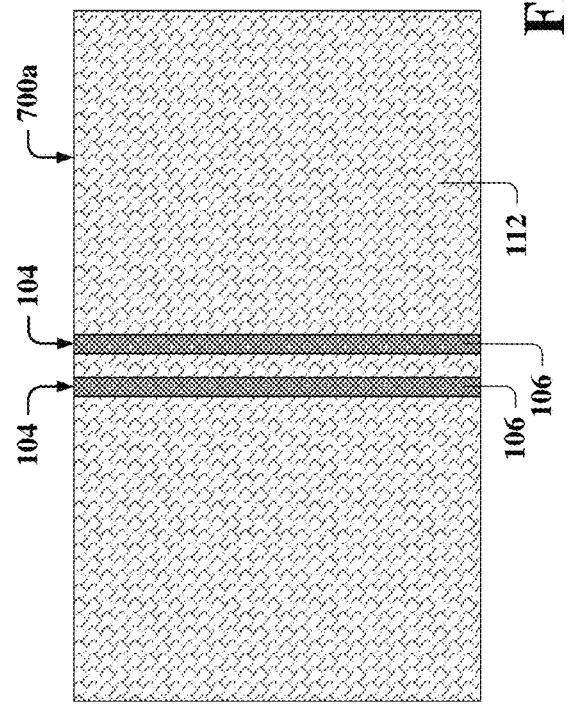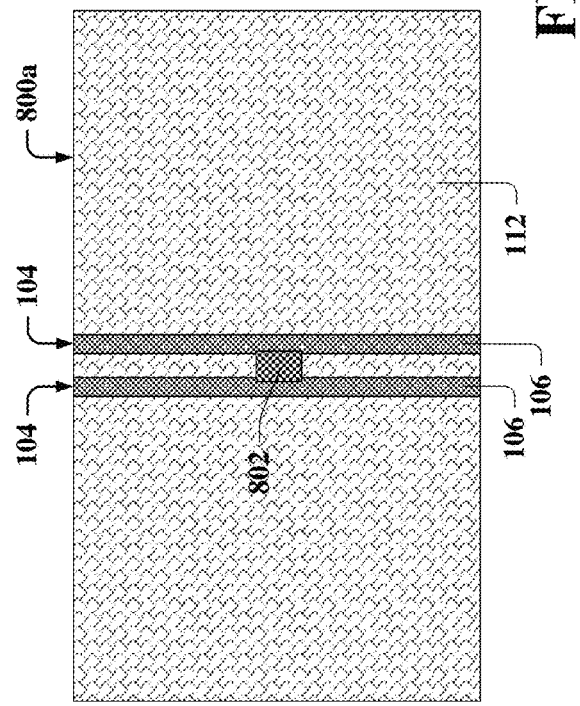
FIG. 8

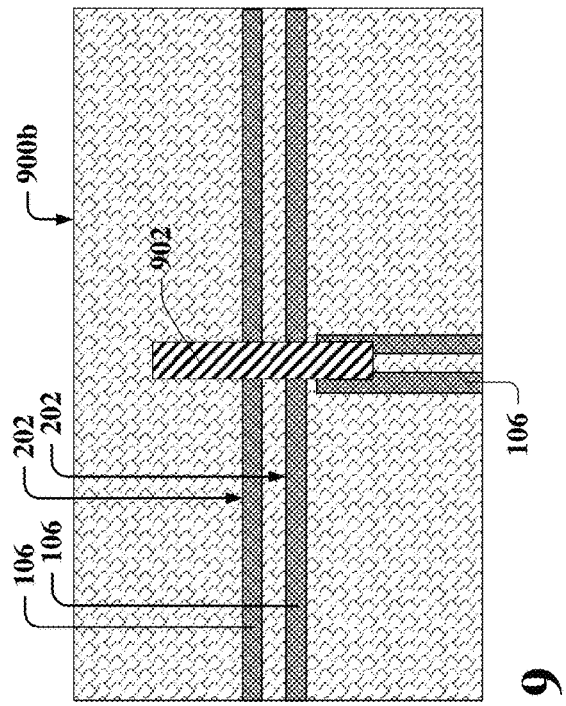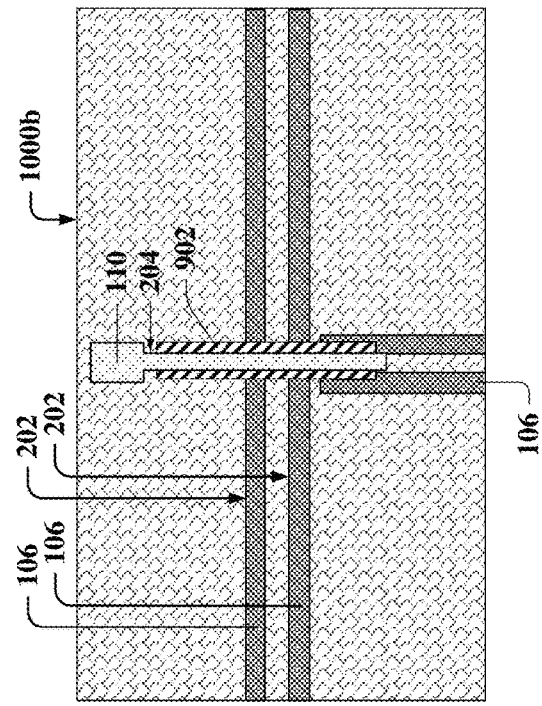
FIG. 9
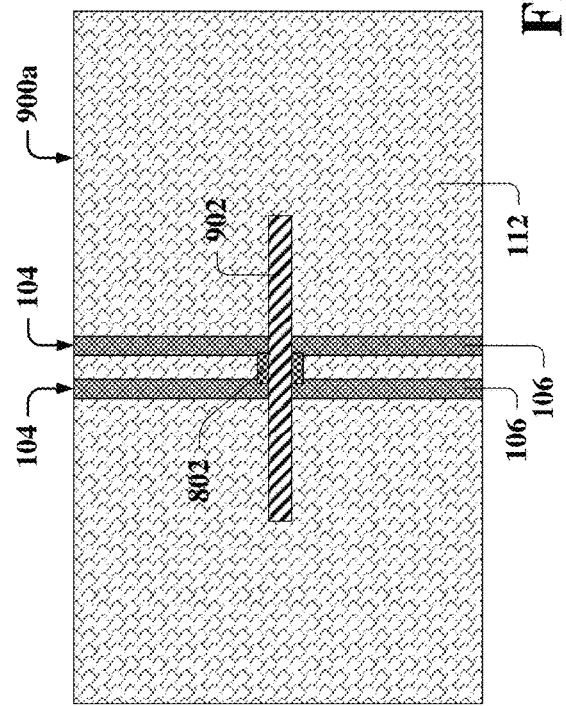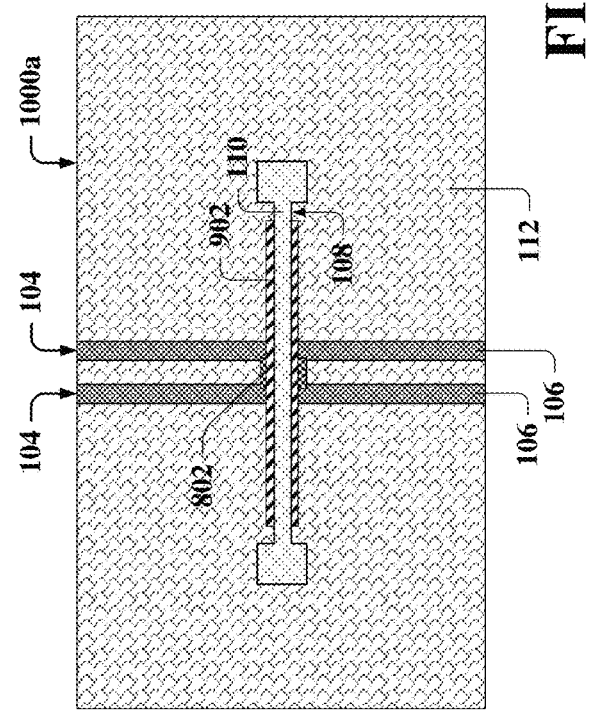
FIG. 10

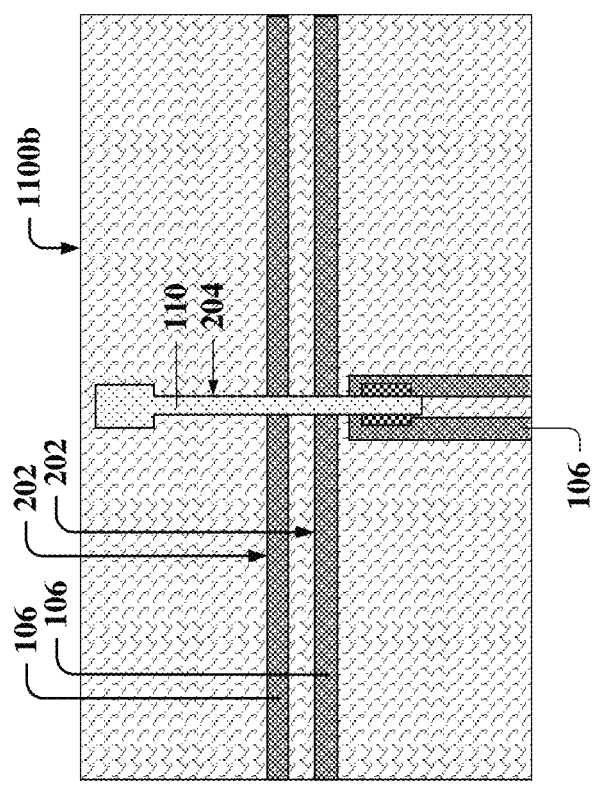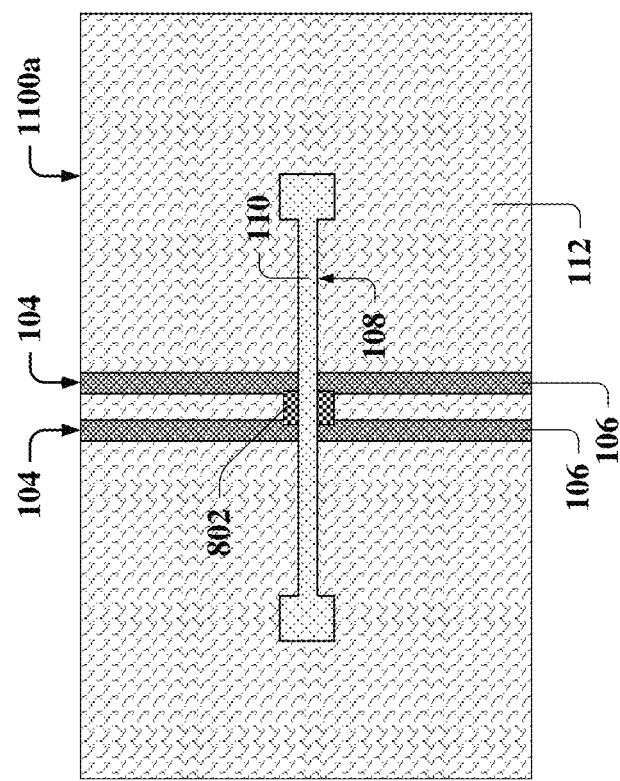
FIG. 11

1302 — Employing a switch device to shift frequency of a readout resonator coupled to a qubit based on position of the switch device, wherein the switch device is formed across the readout resonator.

1304 — Employing a second switch device to shift frequency of a bus resonator coupled to a plurality of qubits based on position of the second switch device, wherein the second switch device is formed across the bus resonator.

FIG. 13

SWITCH DEVICE FACILITATING FREQUENCY SHIFT OF A RESONATOR IN A QUANTUM DEVICE

BACKGROUND

The subject disclosure relates to shifting frequency of a resonator in a quantum device, and more specifically, the subject disclosure relates to a switch device that shifts frequency of a resonator in a quantum device and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate a switch device that shifts frequency of a resonator in a quantum device are described.

According to an embodiment, a device can comprise a readout resonator coupled to a qubit. The device can further comprise a switch device formed across the readout resonator that shifts frequency of the readout resonator based on position of the switch device.

According to an embodiment, a device can comprise a bus resonator coupled to a plurality of qubits. The device can further comprise a switch device formed across the bus resonator that shifts frequency of the bus resonator based on position of the switch device.

According to an embodiment, a method can comprise employing a switch device to shift frequency of a readout resonator coupled to a qubit based on position of the switch device. The switch device is formed across the readout resonator.

DESCRIPTION OF THE DRAWINGS

FIGS. 4A and 4B illustrate a top view and a cross-sectional view, respectively, of the example, non-limiting device of FIGS. 3A and 3B after removal of portions of the sacrificial layer in accordance with one or more embodiments described herein.

FIG. 7 illustrates top views of example, non-limiting alternative embodiments of the example, non-limiting device of FIGS. 6A and 6B after removing portions of the superconducting layer and the remaining portions of the sacrificial layer in accordance with one or more embodiments described herein.

FIG. 8 illustrates top views of the example, non-limiting devices of FIG. 7 after the formation of a dielectric layer in accordance with one or more embodiments described herein.

FIG. 9 illustrates top views of the example, non-limiting devices of FIG. 8 after the formation of a second sacrificial layer in accordance with one or more embodiments described herein.

FIG. 10 illustrates top views of the example, non-limiting devices of FIG. 9 after depositing a metal layer to form a switch device in accordance with one or more embodiments described herein.

FIG. 11 illustrates top views of the example, non-limiting devices of FIG. 10 after removing the second sacrificial layer in accordance with one or more embodiments described herein.

FIGS. 12 and 13 illustrate flow diagrams of example, non-limiting methods that can facilitate implementation of a switch device that shifts frequency of a resonator in a quantum device in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

Quantum computing has the potential to solve problems that, due to their computational complexity, cannot be solved, either at all or for all practical purposes, on a classical computer. However, quantum computing requires very specialized hardware to, for example, read one or more qubits of a quantum device and/or entangle qubits of the quantum device (e.g., change topology of the quantum device).

Figure 1:
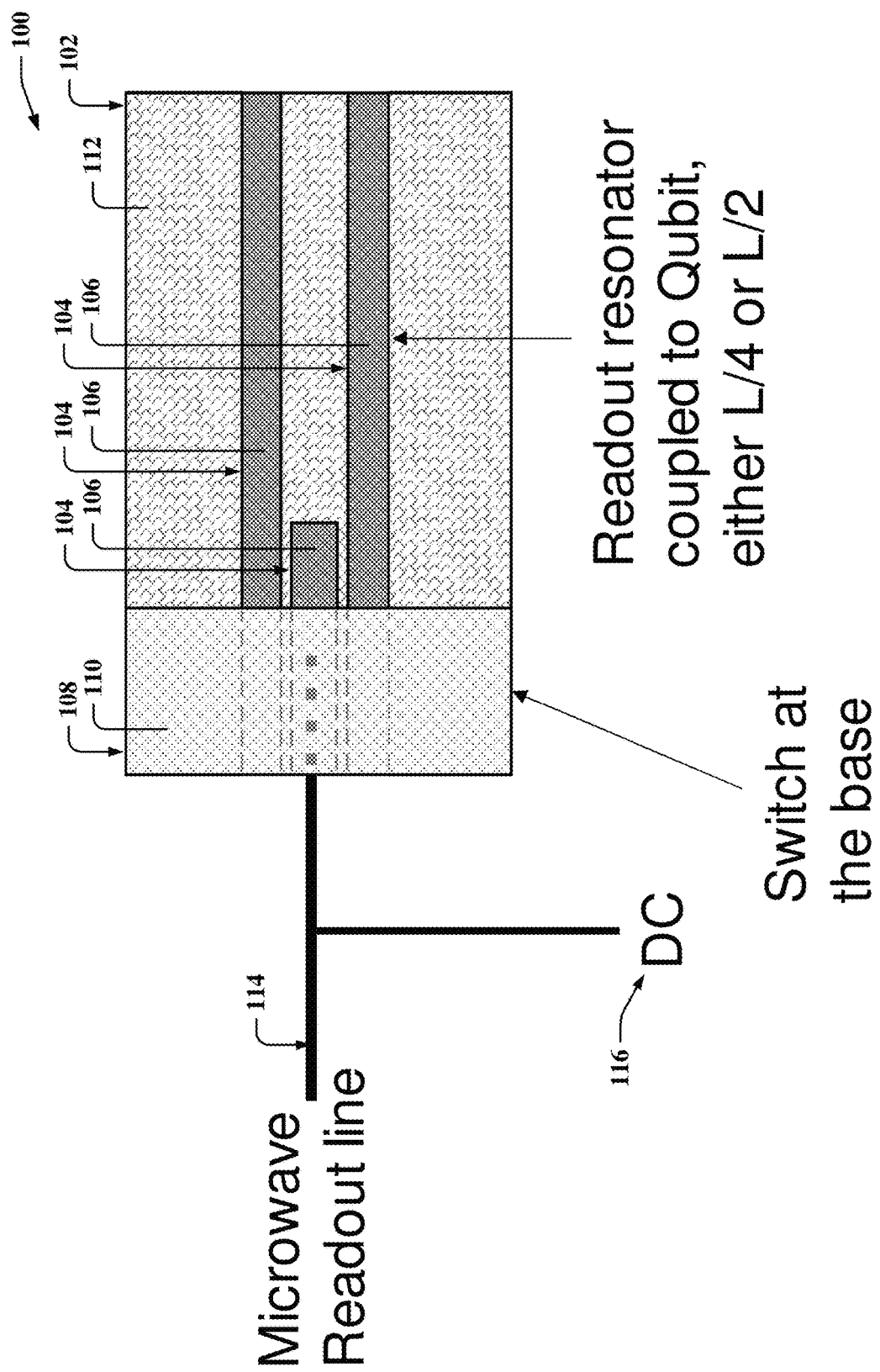
FIG. 1 illustrates a top view of an example, non-limiting system that can facilitate frequency shift of a resonator in a quantum device using a switch device in accordance with one or more embodiments described herein.

FIG. 1 illustrates a top view of an example, non-limiting system 100 that can facilitate frequency shift of a resonator in a quantum device using a switch device in accordance with one or more embodiments described herein. System 100 can comprise a quantum device 102. In an example, quantum device 102 can comprise a superconducting circuit, a quantum circuit, quantum hardware, a quantum processor, a quantum computer, and/or another quantum device.

Quantum device 102 can comprise a readout resonator 104. Readout resonator 104 can comprise a coplanar waveguide readout resonator. Readout resonator 104 can be formed using a dielectric substrate 106 as described below with reference to FIGS. 3A-11.

Quantum device 102 can further comprise a switch device 108. Switch device 108 can comprise radio frequency microelectromechanical system switch. In an example, switch device 108 can comprise a bridge structure suspended across readout resonator 104. Switch device 108 can be formed across readout resonator 104 as illustrated in FIG. 1 using a metal layer 110 as described below with reference to FIGS. 3A-11. Quantum device 102 can further comprise a superconducting layer 112 that can be formed as described below with reference to FIGS. 6A, 6B, and 7.

System 100 can further comprise a qubit (not illustrated in FIG. 1) and/or a microwave readout line 114 coupled to readout resonator 104. For example, microwave readout line 114 can be coupled (e.g., capacitively or inductively) to readout resonator 104 at an input port of quantum device 102 as illustrated in FIG. 1 (or in some embodiments, at another location on quantum device 102 and/or along readout resonator 104). For instance, microwave readout line 114 can be coupled to readout resonator 104 at a location on quantum device 102 where there is coupling capacitance of readout resonator 104. In some embodiments, microwave readout line 114 can be further coupled to a qubit readout component (not illustrated in FIG. 1) such as, for instance, a vector network analyzer (VNA) that can enable readout of such a qubit (e.g., readout of a quantum state of such a qubit) that can be coupled to readout resonator 104 as described above. As utilized herein, when an element is referred to as being "coupled" to another element, it can describe one or more different types of coupling including, but not limited to, capacitive coupling, inductive coupling, chemical coupling, communicative coupling, electrical coupling, physical coupling, operative coupling, optical coupling, thermal coupling, and/or another type of coupling.

System 100 can further comprise a voltage source 116 (denoted as DC in FIG. 1) that can be coupled to quantum device 102 via microwave readout line 114 as illustrated in FIG. 1. Voltage source 116 can comprise a direct current (DC) voltage source that can apply a DC bias (e.g., a DC voltage) to readout resonator 104 and/or switch device 108 to facilitate opening and/or closing switch device 108. For example, voltage source 116 can apply a DC bias to readout resonator 104 and/or switch device 108 to facilitate moving (e.g., pulling) switch device 108 toward readout resonator 104. For instance, voltage source 116 can apply a DC bias to readout resonator 104 and/or switch device 108 to facilitate pulling switch device 108 in a downward direction (e.g., a downward direction with respect to the elements of quantum device 102 depicted FIG. 1) toward readout resonator 104.

Voltage source 116 can apply a DC bias to readout resonator 104 and/or switch device 108 to facilitate moving (e.g., pulling) switch device 108 toward readout resonator 104 to a position defined herein as a closed position where switch device 108 almost makes direct physical contact with readout resonator 104. Such movement of switch device 108 to a closed position as described above can cause a radio frequency (RF) short (e.g., an RF short circuit) and/or a ground (e.g., a ground circuit) on readout resonator 104 that can short the coupling capacitance at the input port of quantum device 102. While such movement of switch device 108 to a closed position can cause an RF short and/or a ground on readout resonator 104, the DC circuit resulting from applying the DC bias (e.g., via voltage source 116) can still be open as, in some embodiments (not illustrated in FIG. 1), a portion of quantum device 102 and/or readout resonator 104 can have a dielectric layer formed thereon (e.g., dielectric layer 802 described below and illustrated in FIGS. 8-11) that can prevent current flow (e.g., can prevent DC current flow and/or a short of the DC circuit).

By causing such an RF short when moved to a closed position as described above, switch device 108 can thereby shift a resonance condition of readout resonator 104. For instance, by causing such an RF short when moved to a closed position as described above, switch device 108 can thereby shift the resonance frequency of readout resonator 104 from a resonant wavelength of $\lambda/2$ (e.g., a resonance frequency of $\lambda/2$) to a resonant wavelength of $\lambda/4$ (e.g., a resonance frequency of $\lambda/4$). Such a shift of the resonance frequency of readout resonator 104 from $\lambda/2$ to $\lambda/4$ when switch device 108 is in a closed position can constitute a conversion by switch device 108 of readout resonator 104 from a readout resonator having a resonant wavelength of $\lambda/2$ (e.g., a resonance frequency of $\lambda/2$) to a readout resonator having a resonant wavelength of $\lambda/4$ (e.g., a resonance frequency of $\lambda/4$).

Such a shift of the resonance frequency of readout resonator 104 from $\lambda/2$ to $\lambda/4$ when switch device 108 is in a closed position can isolate a qubit of quantum device 102 that can be coupled to readout resonator 104 from one or more components external to quantum device 102 (e.g., a VNA). Such a shift of the resonance frequency of readout resonator 104 from $\lambda/2$ to $\lambda/4$ when switch device 108 is in a closed position can further decouple the qubit from the intrinsic impedance environment (e.g., 50 Ohms (Ohm) that the qubit can relax energy into. This type of loss is referred to as Purcell loss. For example, such a shift of the resonance frequency of readout resonator 104 from $\lambda/2$ to $\lambda/4$ when switch device 108 is in a closed position can isolate (e.g., decouple) such a qubit from an environment external to quantum device 102. It should be appreciated that when in a closed position, switch device 108 can shift the frequency of readout resonator 104 to isolate the qubit from such external component(s) and thereby facilitate improved coherence of the qubit, reduced dephasing of the qubit, and/or reduced Purcell loss of quantum device 102. For example, in some embodiments where switch device 108 can be cycled (e.g., greater than 100 billion cycles in an uncontrolled environment) between on time and/or off time (e.g., cycled between closed position and/or open position) for an amount of time measured in microseconds, switch device 108 can facilitate an insertion loss of approximately 0.10 decibels (dB) at room temperature (e.g., approximately 70 degrees Fahrenheit (° F.)).

As described above, switch device 108 can comprise a bridge structure suspended across (e.g., partly across) readout resonator 104. In some embodiments, such a bridge structure of switch device 108 can be formed using a material constituting metal layer 110, where such material can have a certain spring constant. When the DC bias is removed (e.g., when the DC voltage applied by voltage source 116 is turned off), the spring constant of such a bridge structure of switch device 108 can cause switch device 108 to move away from readout resonator 104. For instance, when the DC bias is removed, the spring constant of such a bridge structure of switch device 108 can move (e.g., pull) switch device 108 away from readout resonator 104 (e.g., in an upward direction with respect to the elements of quantum device 102 depicted in FIG. 1) to its original position defined herein as an open position.

When the DC bias is removed and switch device 108 moves to an open position, switch device 108 can thereby shift the resonance frequency of readout resonator 104 from a resonant wavelength of $\lambda/2$ (e.g., a resonance frequency of $\lambda/2$) to a resonant wavelength of $\lambda/4$ (e.g., a resonance frequency of $\lambda/4$). Such a shift of the resonance frequency of readout resonator 104 from $\lambda/4$ to $\lambda/2$ when switch device 108 is in an open position can constitute a conversion by switch device 108 of readout resonator 104 from a readout resonator having a resonant wavelength of $\lambda/2$ (e.g., a resonance frequency of $\lambda/2$) to a readout resonator having a resonant wavelength of $\lambda/4$ (e.g., a resonance frequency of $\lambda/4$). Such a shift of the resonance frequency of readout resonator 104 from $\lambda/4$ to $\lambda/2$ when switch device 108 is in an open position can couple the qubit described above to one or more components external to quantum device 102 (e.g., a VNA). When switch device 108 moves to an open position to shift the frequency of readout resonator 104 from $\lambda/4$ to $\lambda/2$ and enable such coupling of the qubit described above to an external component such as, for instance, a VNA, switch device 108 can thereby enable transmission of a signal (e.g., an RF signal, microwave signal, optical signal, etc.) by such an external component to the qubit. Therefore, when switch device 108 is in an open position, it can enable readout of the qubit (e.g., passive reading of a quantum state of the qubit) using such an external component (e.g., a VNA).

Based on the examples above describing how switch device 108 can shift the frequency (e.g., resonance frequency) of readout resonator 104 from $\lambda/2$ to $\lambda/4$ when moved to a closed position and from $\lambda/4$ to $\lambda/2$ when moved to an open position, it should be appreciated that switch device 108 can shift the frequency of readout resonator 104 based on position of switch device 108.

Figure 2B:
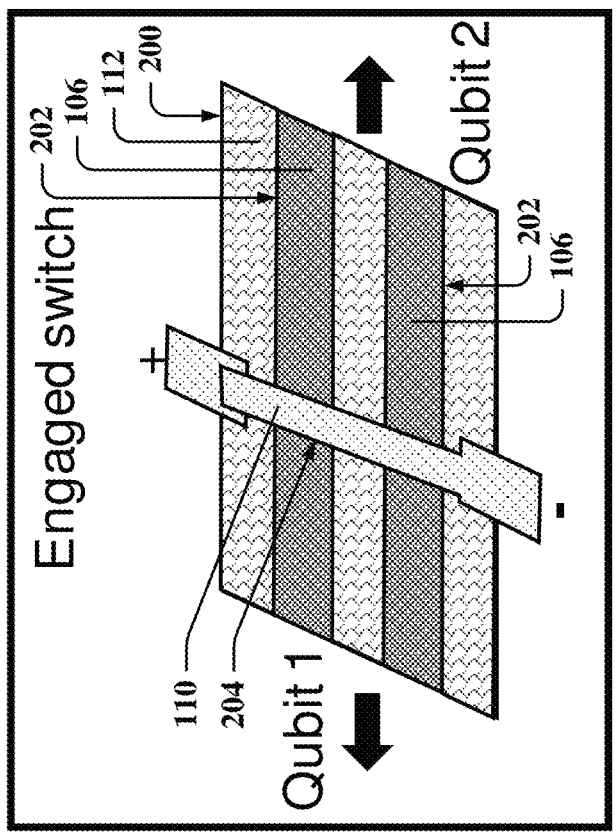
FIGS. 2A and 2B illustrate orthogonal views of an example, non-limiting quantum device that can facilitate frequency shift of a resonator in a quantum device using a switch device in accordance with one or more embodiments described herein.
Figure 2A:
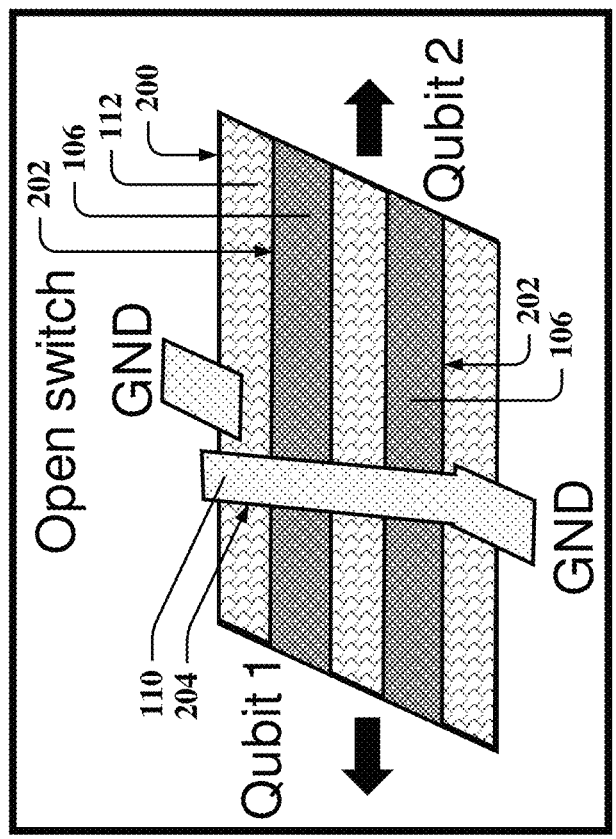

FIGS. 2A and 2B illustrate orthogonal views of an example, non-limiting quantum device 200 that can facilitate frequency shift of a resonator in a quantum device using a switch device in accordance with one or more embodiments described herein. Repetitive description of like elements and/or processes employed in other embodiments described herein is omitted for sake of brevity.

Quantum device 200 can comprise a quantum device including, but not limited to, a superconducting circuit, a quantum circuit, quantum hardware, a quantum processor, a quantum computer, and/or another quantum device. Quantum device 200 can comprise a bus resonator 202. Bus resonator 202 can be formed using dielectric substrate 106 as described below with reference to FIGS. 3A-11.

Quantum device 200 can further comprise a switch device 204. Switch device 204 can comprise radio frequency microelectromechanical system switch. In an example, switch device 204 can comprise a cantilever structure formed across bus resonator 202. Switch device 204 can be formed across bus resonator 202 as illustrated in FIGS. 2A and 2B using metal layer 110 as described below with reference to FIGS. 3A-11. In some embodiments, for example as illustrated in FIGS. 2A and 2B, switch device 204 can be formed across bus resonator 202 at a midpoint of bus resonator 202 (e.g., at a location that is halfway along bus resonator 202). Quantum device 200 can further comprise superconducting layer 112 that can be formed as described below with reference to FIGS. 6A, 6B, and 7.

Although not illustrated in FIG. 2A or 2B, quantum device 200 can further comprise at least two qubits that can be coupled to bus resonator 202. For example, quantum device 200 can comprise Qubit 1 and Qubit 2 as denoted in FIGS. 2A and 2B that can be coupled to bus resonator 202.

Although not illustrated in FIG. 2A or 2B, quantum device 200 can be coupled to a voltage source such as, for instance, voltage source 116. Voltage source 116 can comprise a direct current (DC) voltage source that can apply a DC bias (e.g., a DC voltage) to bus resonator 202 and/or switch device 204 to facilitate opening switch device 204 (e.g., as illustrated by FIG. 2A) and/or closing switch device 204 (e.g., as illustrated by FIG. 2B). For example, voltage source 116 can apply a DC bias to bus resonator 202 and/or switch device 204 to facilitate moving (e.g., pulling) switch device 204 toward bus resonator 202. For instance, voltage source 116 can apply a DC bias to bus resonator 202 and/or switch device 204 to facilitate pulling switch device 204 in a downward direction (e.g., a downward direction with respect to the elements of quantum device 200 depicted FIGS. 2A and 2B) toward bus resonator 202.

Voltage source 116 can apply a DC bias to bus resonator 202 and/or switch device 204 to facilitate moving (e.g., pulling) switch device 204 toward bus resonator 202 to a position defined herein as a closed position (denoted as Engaged switch in FIG. 2B) where switch device 204 almost makes direct physical contact with bus resonator 202. Such movement of switch device 204 to a closed position as described above can cause a radio frequency (RF) short (e.g., an RF short circuit) and/or a ground (e.g., a ground circuit) on bus resonator 202 that can short the coupling between Qubit 1 and Qubit 2 (e.g., can decouple Qubit 1 and Qubit 2). While such movement of switch device 204 to a closed position can cause an RF short and/or a ground on bus resonator 202, the DC circuit resulting from applying the DC bias (e.g., via voltage source 116) can still be open as, in some embodiments (not illustrated in FIG. 2A or 2B), a portion of quantum device 200 and/or bus resonator 202 can have a dielectric layer formed thereon (e.g., dielectric layer 802 described below and illustrated in FIGS. 8-11) that can prevent current flow (e.g., can prevent DC current flow and/or a short of the DC circuit).

By causing such an RF short when moved to a closed position as described above, switch device 204 can thereby shift a resonance condition of bus resonator 202. For instance, by causing such an RF short when moved to a closed position as described above, switch device 204 can thereby shift the resonance frequency of bus resonator 202 from a resonant wavelength of $\lambda/2$ (e.g., a resonance frequency of $\lambda/2$) to a resonant wavelength of $\lambda/4$ (e.g., a resonance frequency of $\lambda/4$). In some embodiments, for example as illustrated in FIGS. 2A and 2B where switch device 204 can be formed at a midpoint along bus resonator 202, such a shift of the resonance frequency of bus resonator 202 from $\lambda/2$ to $\lambda/4$ when switch device 204 is in a closed position can constitute a conversion by switch device 204 of bus resonator 202 from a single bus resonator having a resonant wavelength of $\lambda/2$ (e.g., a resonance frequency of $\lambda/2$) to two bus resonators each having a resonant wavelength of $\lambda/4$ (e.g., a resonance frequency of $\lambda/4$).

Such a shift of the resonance frequency of bus resonator 202 from $\lambda/2$ to $\lambda/4$ when switch device 204 is in a closed position can isolate a first qubit of quantum device 200 that can be coupled to bus resonator 202 from one or more second qubits of quantum device 200 that can also be coupled to bus resonator 202. For example, such a shift of the resonance frequency of bus resonator 202 from $\lambda/2$ to $\lambda/4$ when switch device 204 is in a closed position can isolate (e.g., decouple) Qubit 1 from Qubit 2 illustrated in FIGS. 2A and 2B. It should be appreciated that when in a closed position, switch device 204 can shift the frequency of bus resonator 202 to isolate such a first qubit (e.g., Qubit 1) from one or more second qubits of quantum device 200 (e.g., Qubit 2) and thereby facilitate: improved coherence and/or reduced dephasing of the first and/or second qubit(s); and/or reduced Purcell loss of quantum device 200. For example, in some embodiments where switch device 204 can be cycled (e.g., greater than 100 billion cycles in an uncontrolled environment) between on time and/or off time (e.g., cycled between closed position and/or open position) for an amount of time measured in microseconds, switch device 204 can facilitate an insertion loss of approximately 0.10 decibels (dB) at room temperature (e.g., approximately 70 degrees Fahrenheit (° F.)).

As described above, switch device 204 can comprise a cantilever structure formed across bus resonator 202. In some embodiments, such a cantilever structure of switch device 204 can be formed using a material constituting metal layer 110, where such material can have a certain spring constant. When the DC bias is removed (e.g., when the DC voltage applied by voltage source 116 is turned off), the spring constant of such a cantilever structure of switch device 204 can cause switch device 204 to move away from bus resonator 202 (e.g., as illustrated by FIG. 2A). For instance, when the DC bias is removed, the spring constant of such a cantilever structure of switch device 204 can move (e.g., pull) switch device 204 away from bus resonator 202 (e.g., in an upward direction with respect to the elements of quantum device 200 depicted in FIGS. 2A and 2B) to its original position defined herein as an open position (denoted as Open switch in FIG. 2A).

When the DC bias is removed and switch device 204 moves to an open position (denoted as Open switch in FIG. 2A), switch device 204 can thereby shift the resonance frequency of bus resonator 202 from a resonant wavelength of $\lambda/4$ (e.g., a resonance frequency of $\lambda/4$) to a resonant wavelength of $\lambda/2$ (e.g., a resonance frequency of $\lambda/2$). Such a shift of the resonance frequency of bus resonator 202 from $\lambda/4$ to $\lambda/2$ when switch device 204 is in an open position can constitute a conversion by switch device 204 of bus resonator 202 from a bus resonator having a resonant wavelength of $\lambda/4$ (e.g., a resonance frequency of $\lambda/4$) to a bus resonator having a resonant wavelength of $\lambda/2$ (e.g., a resonance frequency of $\lambda/2$). Such a shift of the resonance frequency of bus resonator 202 from $\lambda/4$ to $\lambda/2$ when switch device 204 is in an open position can couple two or more qubits of quantum device 200, thereby enabling communication between such qubits (e.g., via optical signals, RF signals, microwave signals, etc.) and/or entanglement of such qubits. Conversely, as described above, when switch device 204 is in a closed position it can decouple such two or more qubits of quantum device 200, thereby enabling isolation of such qubits from one another and/or interrupting communication between such qubits (e.g., interrupting transmission and/or receipt of signals between the qubits such as, for instance, optical signals, RF signals, microwave signals, etc.). Therefore, it should be appreciated that switch device 204 can be moved (e.g., via the DC bias) to an open position or a closed position to change the topology (e.g., the coupling configuration of qubits) of quantum device 200.

Based on the examples above describing how switch device 204 can shift the frequency (e.g., resonance frequency) of bus resonator 202 from $\lambda/2$ to $\lambda/4$ when moved to a closed position and from $\lambda/4$ to $\lambda/2$ when moved to an open position, it should be appreciated that switch device 204 can shift the frequency of bus resonator 202 based on position of switch device 204.

FIGS. 3A-11 illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 3A-11 can be implemented to fabricate a quantum device comprising a switch device that shifts a resonance frequency of a resonator in the quantum device. For instance, in accordance with one or more embodiments described herein, the non-limiting multi-step fabrication sequence illustrated in FIGS. 3A-11 can be implemented to fabricate quantum device 1100a and/or quantum device 1100b illustrated in FIG. 11, where such devices can comprise example, non-limiting alternative embodiments of quantum device 102 and/or quantum device 200, respectively.

As described below with reference to FIGS. 3A-11, fabrication of the various embodiments of the subject disclosure described herein and/or illustrated in the figures (e.g., quantum device 102, quantum device 200, quantum device 1100a, quantum device 1100b, etc.) can comprise a multi-step sequence of, for example, photolithographic and/or chemical processing steps that facilitate gradual creation of electronic-based systems, devices, components, and/or circuits in a semiconducting device (e.g., an integrated circuit). For instance, the various embodiments of the subject disclosure described herein and/or illustrated in the figures (e.g., quantum device 102, quantum device 200, quantum device 1100a, quantum device 1100b, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), back grinding techniques, and/or another technique for fabricating an integrated circuit.

As described below with reference to FIGS. 3A-11, the various embodiments of the subject disclosure described herein and/or illustrated in the figures (e.g., quantum device 102, quantum device 200, quantum device 1100a, quantum device 1100b, etc.) can be fabricated using various materials. For example, the various embodiments of the subject disclosure described herein and/or illustrated in the figures (e.g., quantum device 102, quantum device 200, quantum device 1100*a*, quantum device 1100*b*, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, physical coupling, operative coupling, optical coupling, thermal coupling, and/or another type of coupling.

Figure 3A:
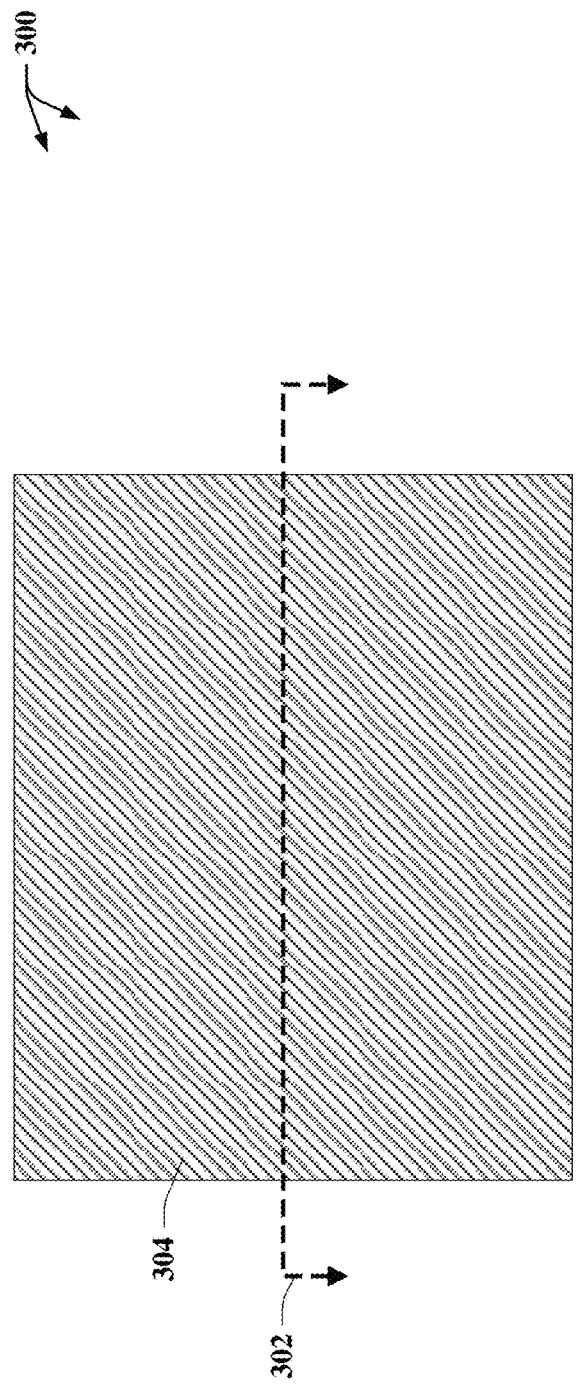
FIGS. 3A and 3B illustrate a top view and a cross-sectional view, respectively, of an example, non-limiting device comprising a dielectric substrate having a sacrificial layer formed thereon in accordance with one or more embodiments described herein.
Figure 3B:
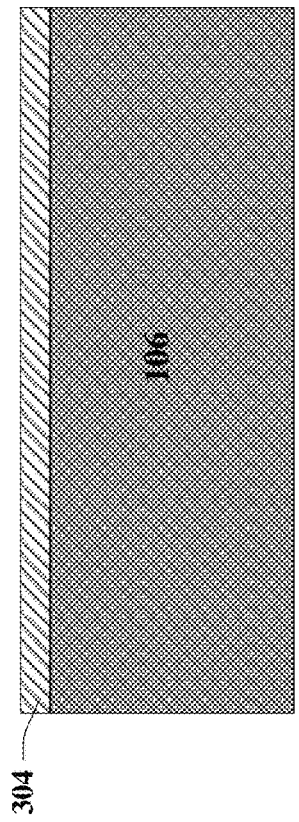

FIGS. 3A and 3B illustrate a top view and a cross-sectional view, respectively, of an example, non-limiting device 300 comprising a dielectric substrate having a sacrificial layer formed thereon in accordance with one or more embodiments described herein. FIG. 3B illustrates a cross-sectional side view of device 300 as viewed along a plane defined by line 302. Repetitive description of like elements and/or processes employed in other embodiments described herein is omitted for sake of brevity.

Device 300 can comprise dielectric substrate 106. Dielectric substrate 106 can comprise a substrate layer. Dielectric substrate 106 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, dielectric substrate 106 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. Dielectric substrate 106 can comprise a thickness (e.g., height) ranging from approximately 50 micrometers (μm) to approximately 1,000 μm.

Device 300 can further comprise a sacrificial layer 304 formed on dielectric substrate 106. Sacrificial layer 304 can comprise a sacrificial oxide layer. Sacrificial layer 304 can be formed on dielectric substrate 106 using one or more deposition processes including, but not limited to, PVD, CVD, ALD, PECVD, spin-on coating, sputtering, and/or another deposition process. Sacrificial layer 304 can comprise a thickness (e.g., height) ranging from approximately 50 nanometers (nm) to approximately 500 nm.

FIGS. 4A and 4B illustrate a top view and a cross-sectional view, respectively, of the example, non-limiting device 300 of FIGS. 3A and 3B after removal of portions of the sacrificial layer in accordance with one or more embodiments described herein. FIG. 4B illustrates a cross-sectional side view of device 400 as viewed along a plane defined by line 402. Repetitive description of like elements and/or processes employed in other embodiments described herein is omitted for sake of brevity.

Device 400 can comprise an example, non-limiting alternative embodiment of device 300 after performing a lithography process and/or an etching process to remove portions of sacrificial layer 304. For example, device 400 can comprise an example, non-limiting alternative embodiment of device 300 after performing: a lithography process (e.g., a lithographic patterning process comprising one or more photolithography, patterning, and/or photoresist techniques defined above) to define a qubit pocket and/or one or more resonators on device 300; and/or an etching process to remove portions of sacrificial layer 304 to form device 400 illustrated in FIGS. 4A and 4B.

Figure 5A:
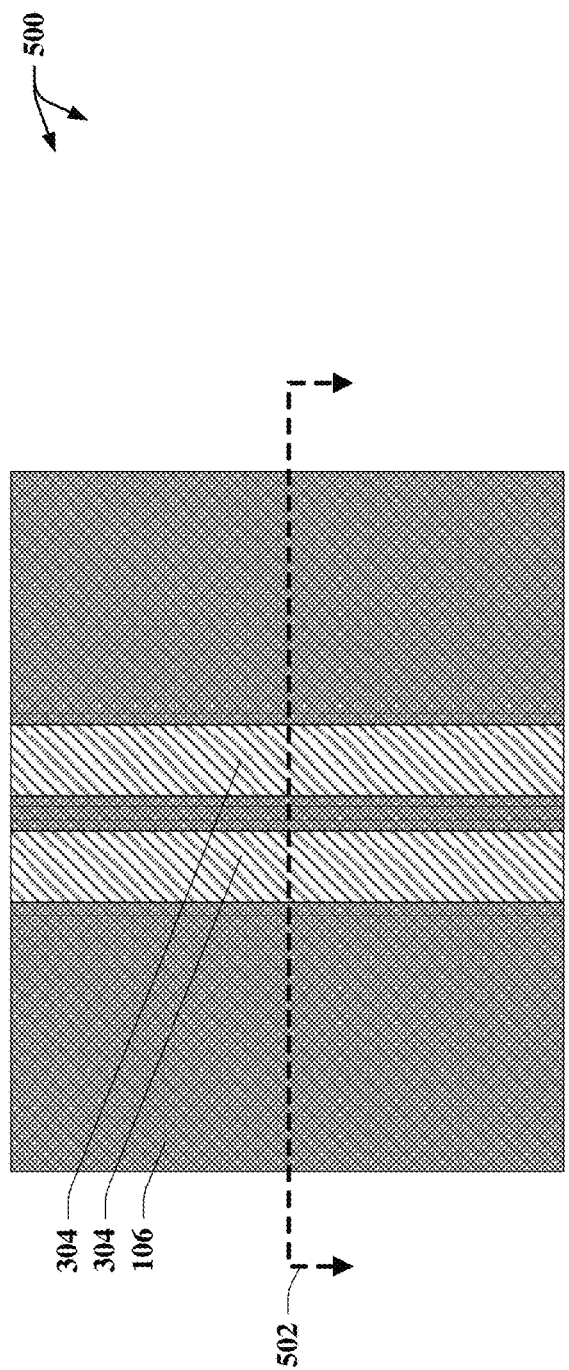
FIGS. 5A and 5B illustrate a top view and a cross-sectional view, respectively, of the example, non-limiting device of FIGS. 4A and 4B after removal of portions of the dielectric substrate in accordance with one or more embodiments described herein.
Figure 5B:
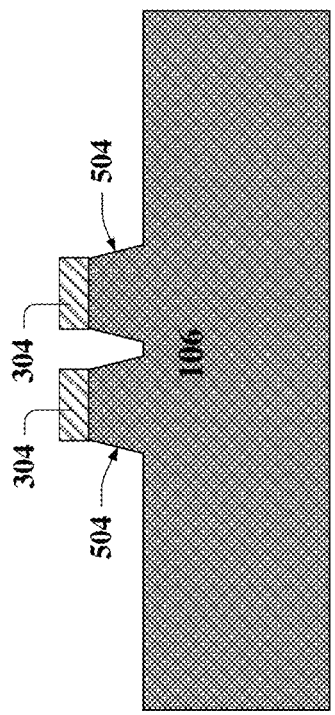

FIGS. 5A and 5B illustrate a top view and a cross-sectional view, respectively, of the example, non-limiting device 400 of FIGS. 4A and 4B after removal of portions of the dielectric substrate in accordance with one or more embodiments described herein. FIG. 5B illustrates a cross-sectional side view of device 500 as viewed along a plane defined by line 502. Repetitive description of like elements and/or processes employed in other embodiments described herein is omitted for sake of brevity.

Device 500 can comprise an example, non-limiting alternative embodiment of device 400 after performing an etching process to remove portions of dielectric substrate 106 resulting in the formation of ridges 504 as illustrated in FIGS. 5A and 5B. For example, device 500 can comprise an example, non-limiting alternative embodiment of device 400 after performing an anisotropic etching process or an isotropic etching process on device 400 to remove portions of dielectric substrate 106 resulting in the formation of ridges 504 as illustrated in FIGS. 5A and 5B.

Figure 6A:
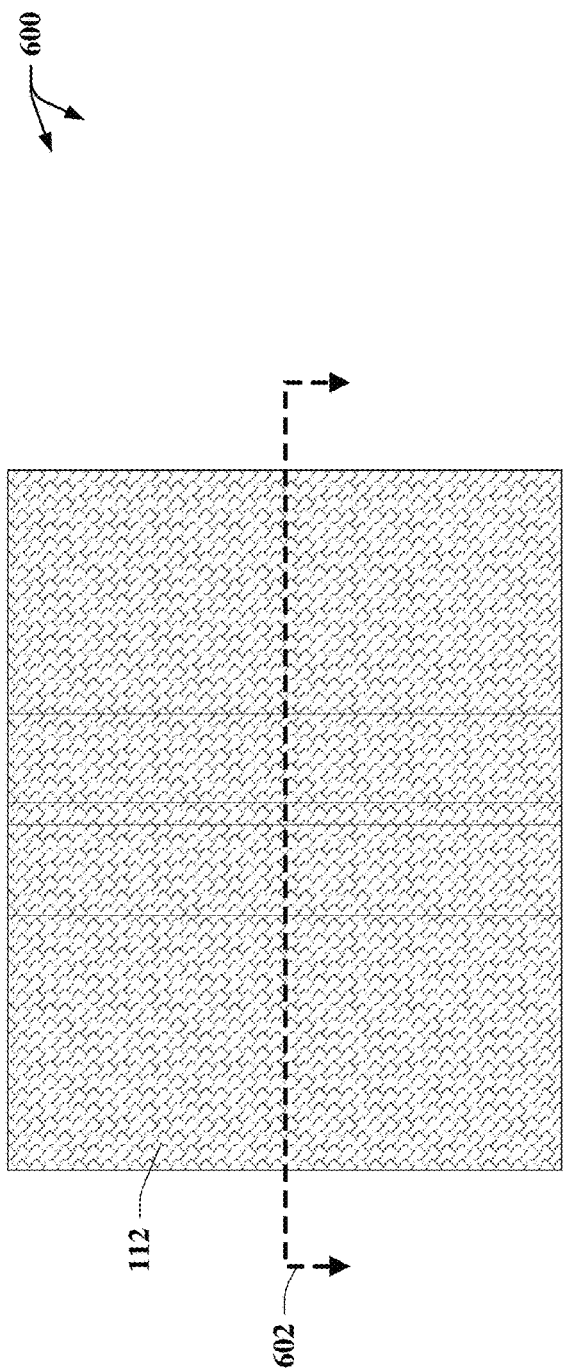
FIGS. 6A and 6B illustrate a top view and a cross-sectional view, respectively, of the example, non-limiting device of FIGS. 5A and 5B after forming a superconducting layer in accordance with one or more embodiments described herein.
Figure 6B:
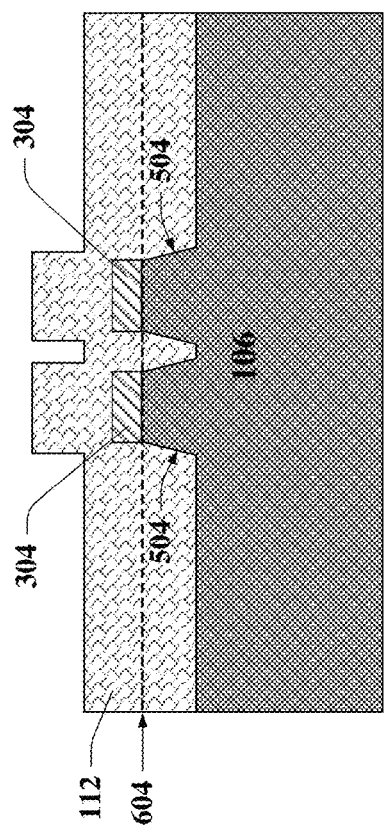

FIGS. 6A and 6B illustrate a top view and a cross-sectional view, respectively, of the example, non-limiting device 500 of FIGS. 5A and 5B after forming a superconducting layer in accordance with one or more embodiments described herein. FIG. 6B illustrates a cross-sectional side view of device 600 as viewed along a plane defined by line 602. Repetitive description of like elements and/or processes employed in other embodiments described herein is omitted for sake of brevity.

Device 600 can comprise an example, non-limiting alternative embodiment of device 500 after forming superconducting layer 112 on dielectric substrate 106, the remaining portions of sacrificial layer 304, and/or ridges 504 as depicted in FIGS. 6A and 6B. Superconducting layer 112 can comprise a superconducting metal. For example, superconducting layer 112 can comprise niobium (Nb) and/or another superconducting metal. Superconducting layer 112 can be formed on dielectric substrate 106, the remaining portions of sacrificial layer 304, and/or ridges 504 using one or more deposition processes including, but not limited to, PVD, CVD, ALD, PECVD, spin-on coating, sputtering, and/or another deposition process. Superconducting layer 112 can comprise a thickness (e.g., height) ranging from approximately 20 nm to approximately 500 nm.

In some embodiments, based on formation of superconducting layer 112 on dielectric substrate 106, the remaining portions of sacrificial layer 304, and/or ridges 504 as described above and illustrated in FIGS. 6A and 6B, portions of superconducting layer 112 and/or all of the remaining portions of sacrificial layer 304 can be removed from device 600 to expose a surface (e.g., a top surface) of each of ridges 504. For example, based on such formation of superconducting layer 112 as described above and illustrated in FIGS.

6A and 6B, portions of superconducting layer 112 and/or all of the remaining portions of sacrificial layer 304 can be removed from device 600 down to line 604 depicted in FIG. 6B to expose a surface (e.g., a top surface) of each of ridges 504. Such portions of superconducting layer 112 and/or all of the remaining portions of sacrificial layer 304 can be removed from device 600 down to line 604 depicted in FIG. 6B using a chemical mechanical polish (CMP) process and/or an oxide removal process.

Removal of such portions of superconducting layer 112 and/or all of the remaining portions of sacrificial layer 304 as described above can be performed to define a primary qubit circuit of a quantum device. For example, removal of such portions of superconducting layer 112 and/or all of the remaining portions of sacrificial layer 304 as described above can be performed to define readout resonator 104 of quantum device 102 and/or quantum device 1100a described below and illustrated in FIG. 11. In another example, removal of such portions of superconducting layer 112 and/or all of the remaining portions of sacrificial layer 304 as described above can be performed to define bus resonator 202 of quantum device 200 and/or quantum device 1100b described below and illustrated in FIG. 11.

FIG. 7 illustrates top views of example, non-limiting alternative embodiments of the example, non-limiting device 600 of FIGS. 6A and 6B after removing portions of the superconducting layer and the remaining portions of the sacrificial layer in accordance with one or more embodiments described herein. Repetitive description of like elements and/or processes employed in other embodiments described herein is omitted for sake of brevity.

Device 700a depicted in FIG. 7 can comprise an example, non-limiting alternative embodiment of device 600 after removal of portions of superconducting layer 112 and/or all of the remaining portions of sacrificial layer 304 to define readout resonator 104 as described above. Device 700b also depicted in FIG. 7 can comprise an example, non-limiting alternative embodiment of device 600 and/or after removal of portions of superconducting layer 112 and/or all of the remaining portions of sacrificial layer 304 to define bus resonator 202 as described above.

In some embodiments, as described below with reference to FIGS. 8-11, device 700a can be developed into quantum device 1100a illustrated in FIG. 11, where quantum device 1100a can comprise an example, non-limiting alternative embodiment of quantum device 102. In some embodiments, as described below with reference to FIGS. 8-11, device 700b can be developed into quantum device 1100b also illustrated in FIG. 11, where quantum device 1100b can comprise an example, non-limiting alternative embodiment of quantum device 200.

FIG. 8 illustrates top views of the example, non-limiting devices 700a, 700b of FIG. 7 after the formation of a dielectric layer in accordance with one or more embodiments described herein. Repetitive description of like elements and/or processes employed in other embodiments described herein is omitted for sake of brevity.

Device 800a depicted in FIG. 8 can comprise an example, non-limiting alternative embodiment of device 700a after formation of a dielectric layer 802 as illustrated in FIG. 8. Device 800b also depicted in FIG. 8 can comprise an example, non-limiting alternative embodiment of device 700b after formation of dielectric layer 802 as illustrated in FIG. 8.

Dielectric layer 802 can comprise a dielectric material including, but not limited to, silicon nitride (SiN), diamond, and/or another dielectric material. Dielectric layer 802 can be formed as depicted in FIG. 8 using: a) one or more deposition processes defined above (e.g., PVD, CVD, ALD, PECVD, spin-on coating, sputtering, etc.) to deposit dielectric layer 802 onto device 700a and/or device 700b; b) a lithography process (e.g., a lithographic patterning process comprising one or more photolithography, patterning, and/or photoresist techniques defined above) to define the shape of dielectric layer 802; and/or c) an etching process to remove unwanted portions of dielectric layer 802 to form device 800a and/or device 800b illustrated in FIG. 8.

FIG. 9 illustrates top views of the example, non-limiting devices 800a, 800b of FIG. 8 after the formation of a second sacrificial layer in accordance with one or more embodiments described herein. Repetitive description of like elements and/or processes employed in other embodiments described herein is omitted for sake of brevity.

Device 900a depicted in FIG. 9 can comprise an example, non-limiting alternative embodiment of device 800a after formation of a second sacrificial layer 902 as illustrated in FIG. 9. Device 900b also depicted in FIG. 9 can comprise an example, non-limiting alternative embodiment of device 800b after formation of second sacrificial layer 902 as illustrated in FIG. 9.

Second sacrificial layer 902 can comprise titanium (Ti) and/or another material. Second sacrificial layer 902 can be formed as depicted in FIG. 9 using: a) one or more deposition processes defined above (e.g., PVD, CVD, ALD, PECVD, spin-on coating, sputtering, etc.) to deposit second sacrificial layer 902 onto device 800a and/or device 800b; b) a lithography process (e.g., a lithographic patterning process comprising one or more photolithography, patterning, and/or photoresist techniques defined above) to define the shape of second sacrificial layer 902; and/or c) an etching process to remove unwanted portions of second sacrificial layer 902 to form device 900a and/or device 900b illustrated in FIG. 9.

FIG. 10 illustrates top views of the example, non-limiting devices 900a, 900b of FIG. 9 after depositing a metal layer to form a switch device in accordance with one or more embodiments described herein. Repetitive description of like elements and/or processes employed in other embodiments described herein is omitted for sake of brevity.

Device 1000a depicted in FIG. 10 can comprise an example, non-limiting alternative embodiment of device 900a after depositing metal layer 110 to form switch device 108 as illustrated in FIG. 10. Device 1000b also depicted in FIG. 10 can comprise an example, non-limiting alternative embodiment of device 900b after depositing metal layer 110 to form switch device 204 as illustrated in FIG. 10.

Metal layer 110 can comprise aluminum (Al) and/or another material. Metal layer 110 can be formed as depicted in FIG. 10 using: a) one or more deposition processes defined above (e.g., PVD, CVD, ALD, PECVD, spin-on coating, sputtering, etc.) to deposit metal layer 110 onto device 900a and/or device 900b; b) a lithography process (e.g., a lithographic patterning process comprising one or more photolithography, patterning, and/or photoresist techniques defined above) to define the shape of metal layer 110 (e.g., to define the shape of switch device 108 and/or switch device 204); and/or c) an etching process to remove unwanted portions of metal layer 110 to form switch device 108 of device 1000a and/or switch device 204 of device 1000b illustrated in FIG. 10.

FIG. 11 illustrates top views of the example, non-limiting devices 1000a, 1000b of FIG. 10 after removing the second sacrificial layer in accordance with one or more embodiments described herein. Repetitive description of like elements and/or processes employed in other embodiments described herein is omitted for sake of brevity.

Quantum device 1100a depicted in FIG. 11 can comprise an example, non-limiting alternative embodiment of device 1000a after removing second sacrificial layer 902 as illustrated in FIG. 11. Quantum device 1100b also depicted in FIG. 11 can comprise an example, non-limiting alternative embodiment of device 1000b after removing second sacrificial layer 902 as illustrated in FIG. 11. Second sacrificial layer 902 can be removed from device 1000a and/or device 1000b by performing an etching process using an etching substance that is compatible with the materials used to form one or more elements of device 1000a and/or device 1000b (e.g., dielectric substrate 106, metal layer 110, superconducting layer 112, etc.). For example, second sacrificial layer 902 can be removed from device 1000a and/or device 1000b by performing an etching process using peroxide, hydrogen fluoride (HF) vapor, and/or another etching substance.

As described above, quantum device 1100a can comprise an example, non-limiting alternative embodiment of quantum device 102, where quantum device 1100a can comprise switch device 108 that can shift the resonance frequency of readout resonator 104 (e.g., via applying a DC bias using voltage source 116) as described above with reference to FIG. 1. Additionally, or alternatively, as described above, quantum device 1100b can comprise an example, non-limiting alternative embodiment of quantum device 200, where quantum device 1100b can comprise switch device 204 that can shift the resonance frequency of bus resonator 202 (e.g., via applying a DC bias using voltage source 116) as described above with reference to FIG. 2.

The various embodiments of the subject disclosure described herein and/or illustrated in the figures (e.g., quantum device 102, quantum device 200, quantum device 1100a, quantum device 1100b, etc.) can be associated with various technologies. For example, quantum device 102, quantum device 200, quantum device 1100a, and/or quantum device 1100b can be associated with semiconductor and/or superconductor device technologies, semiconductor and/or superconductor device fabrication technologies, quantum computing device technologies, quantum computing device fabrication technologies, radio frequency microelectromechanical system switch technologies, radio frequency microelectromechanical system switch fabrication technologies, and/or other technologies.

The various embodiments of the subject disclosure described herein and/or illustrated in the figures (e.g., quantum device 102, quantum device 200, quantum device 1100a, quantum device 1100b, etc.) can provide technical improvements to the various technologies listed above. For example, as described herein, when switch device 108 of quantum device 102 and/or quantum device 1100a is in a closed position it can shift the frequency of readout resonator 104 from $\lambda/2$ to $\lambda/4$ to isolate a qubit from one or more components external to quantum device 102 and thereby facilitate improved coherence of the qubit, reduced dephasing of the qubit, and/or reduced Purcell loss of quantum device 102 and/or quantum device 1100a. In another example, as described herein, when switch device 204 of quantum device 200 and/or quantum device 1100b is in a closed position it can shift the frequency of bus resonator 202 from $\lambda/2$ to $\lambda/4$ to isolate a first qubit from one or more second qubits and thereby facilitate: improved coherence and/or reduced dephasing of the first and/or second qubit(s); and/or reduced Purcell loss of quantum device 200 and/or quantum device 1100b.

The various embodiments of the subject disclosure described herein and/or illustrated in the figures, for instance, quantum device 102, quantum device 200, quantum device 1100a, and/or quantum device 1100b can provide technical improvements to a processing unit associated with such a device(s). For example, by improving coherence and/or reducing dephasing of one or more qubits of quantum device 102, quantum device 200, quantum device 1100a, and/or quantum device 1100b using switch device 108 and/or switch device 204 as described above, such devices can thereby facilitate improved processing efficiency, performance, and/or accuracy of a quantum computing device (e.g., a quantum processor) comprising one or more of such devices. Such improved processing efficiency, performance, and/or accuracy of a quantum computing device (e.g., a quantum processor) comprising quantum device 102, quantum device 200, quantum device 1100a, and/or quantum device 1100b can further facilitate fast and/or possibly universal quantum computing.

A practical application of the various embodiments of the subject disclosure described herein and/or illustrated in the figures (e.g., quantum device 102, quantum device 200, quantum device 1100a, quantum device 1100b, etc.) is they can be implemented independently and/or in a quantum computing device (e.g., a quantum computer) to change the topology (e.g., the coupling configuration of qubits) of such a device(s). Such a practical application can improve the output (e.g., computation and/or processing results) of one or more compilation jobs (e.g., quantum computing jobs) that are executed on such a device(s).

It should be appreciated that the various embodiments of the subject disclosure described herein and/or illustrated in the figures (e.g., quantum device 102, quantum device 200, quantum device 1100a, quantum device 1100b, etc.) provide a new approach driven by relatively new quantum computing technologies. For example, quantum device 102, quantum device 200, quantum device 1100a, and/or quantum device 1100b provide a new approach to improve coherence and/or reduce dephasing of one or more qubits and/or reduced Purcell loss of such devices.

The various embodiments of the subject disclosure described herein and/or illustrated in the figures (e.g., quantum device 102, quantum device 200, quantum device 1100a, quantum device 1100b, etc.) can be coupled to hardware and/or software to solve problems that are highly technical in nature, that are not abstract and that cannot be performed as a set of mental acts by a human. For example, quantum device 102, quantum device 200, quantum device 1100a, and/or quantum device 1100b can be implemented in a quantum computing device that can process information and/or execute calculations that are not abstract and that cannot be performed as a set of mental acts by a human.

It should be appreciated that the various embodiments of the subject disclosure described herein and/or illustrated in the figures (e.g., quantum device 102, quantum device 200, quantum device 1100a, quantum device 1100b, etc.) can utilize various combinations of electrical components, mechanical components, and circuitry that cannot be replicated in the mind of a human or performed by a human. For example, fabricating a quantum device (e.g., quantum device 102, quantum device 200, quantum device 1100a, quantum device 1100b, etc.) comprising one or more switch devices (e.g., switch device 108, switch device 204) that can shift resonance frequency of one or more resonators of such a quantum device is an operation that is greater than the capability of a human mind. For instance, the amount of data processed, the speed of processing such data, and/or the types of data processed over a certain period of time by such a quantum device utilizing such a switch device(s) can be greater, faster, and/or different than the amount, speed, and/or data type that can be processed by a human mind over the same period of time.

According to several embodiments, the various embodiments of the subject disclosure described herein and/or illustrated in the figures (e.g., quantum device 102, quantum device 200, quantum device 1100a, quantum device 1100b, etc.) can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that the various embodiments of the subject disclosure described herein and/or illustrated in the figures (e.g., quantum device 102, quantum device 200, quantum device 1100a, quantum device 1100b, etc.) can include information that is impossible to obtain manually by an entity, such as a human user. For example, the type, amount, and/or variety of information included in quantum device 102, quantum device 200, quantum device 1100a, and/or quantum device 1100b can be more complex than information obtained manually by a human user.

Figure 12:
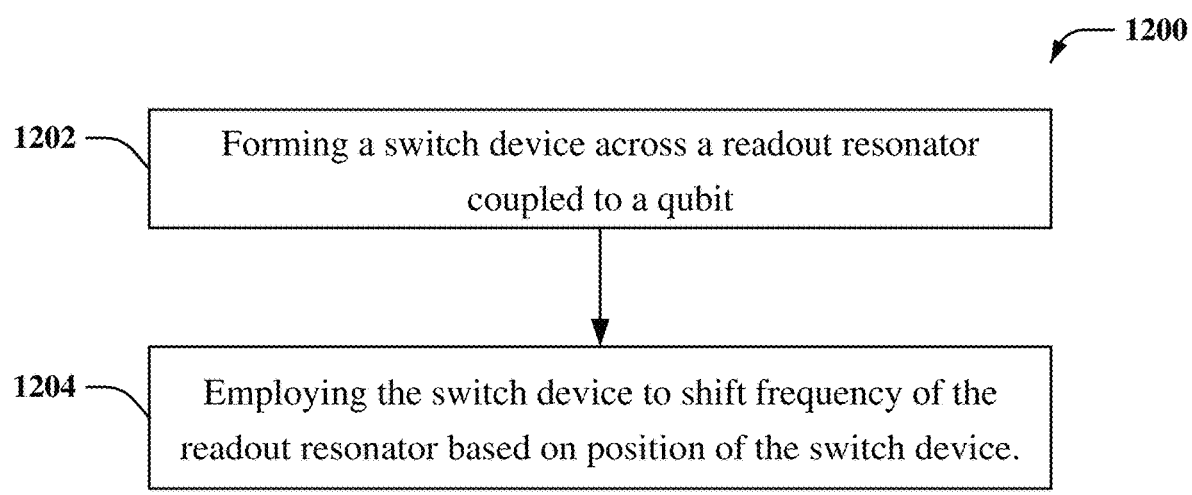

FIG. 12 illustrates a flow diagram of an example, non-limiting method 1200 that can facilitate implementation of a switch device that shifts frequency of a resonator in a quantum device in accordance with one or more embodiments described herein. Repetitive description of like elements and/or processes employed in other embodiments described herein is omitted for sake of brevity.

Method 1200 can be implemented by a computing system (e.g., operating environment 1400 illustrated in FIG. 14 and described below) and/or a computing device (e.g., computer 1412 illustrated in FIG. 14 and described below). In non-limiting example embodiments, such computing system (e.g., operating environment 1400) and/or such computing device (e.g., computer 1412) can comprise one or more processors and one or more memory devices that can store executable instructions thereon that, when executed by the one or more processors, can facilitate performance of the operations described herein, including the non-limiting operations of method 1200 illustrated in FIG. 12. As a non-limiting example, the one or more processors can facilitate performance of the operations described herein, for example, method 1200, by directing and/or controlling one or more systems and/or equipment operable to perform fabrication of a semiconducting and/or superconducting device. As another non-limiting example, the one or more processors can facilitate performance of the operations described herein, for example, method 1200, by directing and/or controlling one or more systems and/or equipment (e.g., voltage source 116) operable to provide a DC bias as described above.

At 1202, method 1200 can comprise forming (e.g., via computer 1412) a switch device (e.g., switch device 108) across a readout resonator (e.g., readout resonator 104) coupled to a qubit (e.g., a qubit of quantum device 102).

At 1204, method 1200 can comprise employing (e.g., by applying a DC bias using voltage source 116 and/or computer 1412) the switch device to shift frequency of the readout resonator (e.g., to shift the resonance frequency of readout resonator 104 from $\lambda/2$ to $\lambda/4$ and vice versa as described above with reference to FIG. 1) based on position of the switch device (e.g., a closed position and/or an open position).

FIG. 13 illustrates a flow diagram of an example, non-limiting method 1300 that can facilitate implementation of a switch device that shifts frequency of a resonator in a quantum device in accordance with one or more embodiments described herein. Repetitive description of like elements and/or processes employed in other embodiments described herein is omitted for sake of brevity.

Method 1300 can be implemented by a computing system (e.g., operating environment 1400 illustrated in FIG. 14 and described below) and/or a computing device (e.g., computer 1412 illustrated in FIG. 14 and described below). In non-limiting example embodiments, such computing system (e.g., operating environment 1400) and/or such computing device (e.g., computer 1412) can comprise one or more processors and one or more memory devices that can store executable instructions thereon that, when executed by the one or more processors, can facilitate performance of the operations described herein, including the non-limiting operations of method 1300 illustrated in FIG. 13. As a non-limiting example, the one or more processors can facilitate performance of the operations described herein, for example, method 1300, by directing and/or controlling one or more systems and/or equipment operable to perform fabrication of a semiconducting and/or superconducting device. As another non-limiting example, the one or more processors can facilitate performance of the operations described herein, for example, method 1300, by directing and/or controlling one or more systems and/or equipment (e.g., voltage source 116) operable to provide a DC bias as described above.

At 1302, method 1300 can comprise employing (e.g., by applying a DC bias using computer 1412 and/or voltage source 116) a switch device (e.g., switch device 108) to shift frequency of a readout resonator (e.g., to shift the resonance frequency of readout resonator 104 from $\lambda/2$ to $\lambda/4$ and vice versa as described above with reference to FIG. 1) coupled to a qubit (e.g., a qubit of quantum device 102) based on position (e.g., open, closed, etc.) of the switch device, wherein the switch device is formed (e.g., via computer 1412) across the readout resonator.

At 1304, method 1300 can comprise employing (e.g., by applying a DC bias using computer 1412 and/or voltage source 116) a second switch device (e.g., switch device 204) to shift frequency of a bus resonator (e.g., to shift the resonance frequency of bus resonator 202 from $\lambda/2$ to $\lambda/4$ and vice versa as described above with reference to FIG. 2) coupled to a plurality of qubits (e.g., Qubit 1 and Qubit 2 described above with reference to FIGS. 2A and 2B) based on position (e.g., open, closed, etc.) of the second switch device, wherein the second switch device is formed across the bus resonator.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 14:
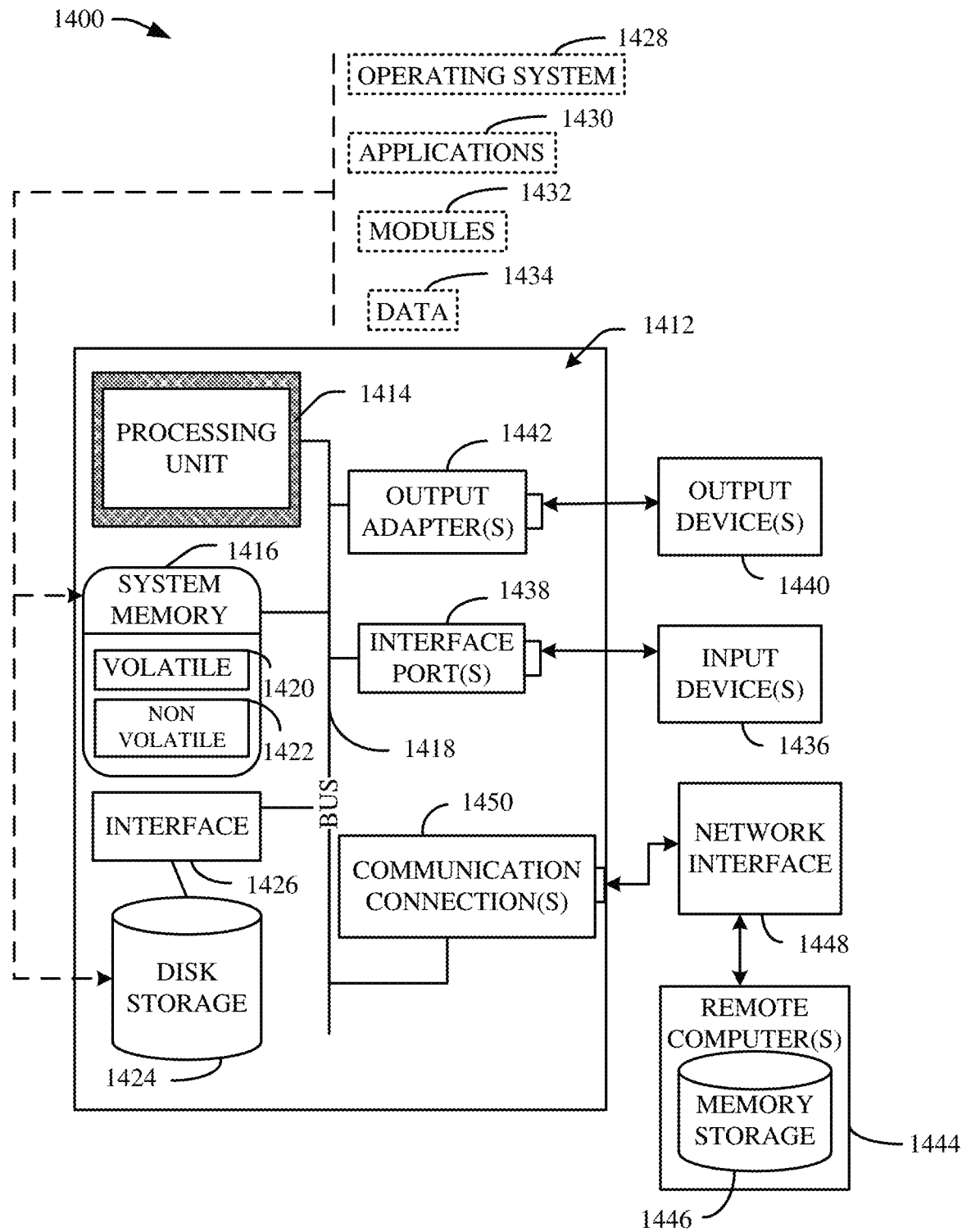
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. For example, operating environment 1400 can be used to implement the example, non-limiting method 1200 of FIG. 12 and/or the example, non-limiting method 1300 of FIG. 13, which can facilitate implementation of one or more embodiments of the subject disclosure described herein. Repetitive description of like elements and/or processes employed in other embodiments described herein is omitted for sake of brevity.

With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media. To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412.

System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a readout resonator coupled to a qubit; and
    a switch device formed across the readout resonator that shifts frequency of the readout resonator based on position of the switch device.

2. The device of claim 1, wherein the switch device comprises a radio frequency microelectromechanical system switch.

3. The device of claim 1, wherein at a closed position the switch device causes at least one of a radio frequency short or a ground on the readout resonator that shifts at least one of the frequency of the readout resonator or a resonance condition of the readout resonator.

4. The device of claim 1, wherein at a closed position the switch device converts the readout resonator from a first readout resonator having a first resonant wavelength of $\lambda/2$ to a second readout resonator having a second resonant wavelength of $\lambda/4$ or alters the resonance frequency.

5. The device of claim 1, wherein at a closed position the switch device shifts the frequency of the readout resonator to isolate the qubit from one or more components external to the device, thereby facilitating at least one of improved coherence of the qubit, reduced dephasing of the qubit, or reduced Purcell loss of the device.

6. A device, comprising:
    a bus resonator coupled to a plurality of qubits; and
    a switch device formed across the bus resonator that shifts frequency of the bus resonator based on position of the switch device.

7. The device of claim 6, wherein the switch device comprises a radio frequency microelectromechanical system switch.

8. The device of claim 6, wherein the switch device is formed across the bus resonator at a midpoint along the bus resonator.

9. The device of claim 6, wherein at a closed position the switch device causes at least one of a radio frequency short or a ground on the bus resonator that shifts at least one of the frequency of the bus resonator or a resonance condition of the bus resonator.

10. The device of claim 6, wherein at a closed position the switch device converts the bus resonator from a single bus resonator having a resonant wavelength of $\lambda/2$ to two bus resonators having resonant wavelengths of $\lambda/4$.

11. The device of claim 6, wherein at a closed position the switch device shifts the frequency of the bus resonator to isolate a first qubit of the plurality of qubits from a second qubit of the plurality of qubits, thereby facilitating at least one of: improved coherence or reduced dephasing of at least one of the first qubit or the second qubit; or reduced Purcell loss of the device.

12. A method, comprising:
    employing a switch device to shift frequency of a readout resonator coupled to a qubit based on position of the switch device, wherein the switch device is formed across the readout resonator.

13. The method of claim 12, further comprising:
    moving the switch device to a closed position to cause at least one of a radio frequency short or a ground on the readout resonator that shifts at least one of the frequency of the readout resonator or a resonance condition of the readout resonator.

14. The method of claim 12, further comprising:
    moving the switch device to a closed position to convert the readout resonator from a first readout resonator having a first resonant wavelength of $\lambda/2$ to a second readout resonator having a second resonant wavelength of $\lambda/4$.

15. The method of claim 12, further comprising:
    moving the switch device to a closed position to isolate the qubit from one or more components external to a quantum device comprising the qubit.

16. The method of claim 12, further comprising:
    employing a second switch device to shift frequency of a bus resonator coupled to a plurality of qubits based on position of the second switch device, wherein the second switch device is formed across the bus resonator.

17. The method of claim 16, wherein the forming comprises:
    forming the second switch device across the bus resonator at a midpoint along the bus resonator.

18. The method of claim 16, further comprising:
    moving the second switch device to a closed position to cause at least one of a radio frequency short or a ground on the bus resonator that shifts at least one of the frequency of the bus resonator or a resonance condition of the bus resonator.

19. The method of claim 16, further comprising:
    moving the second switch device to a closed position to convert the bus resonator from a single bus resonator having a resonant wavelength of $\lambda/2$ to two bus resonators having resonant wavelengths of $\lambda/4$.

20. The method of claim 16, further comprising:
    moving the second switch device to a closed position to isolate a first qubit of the plurality of qubits from a second qubit of the plurality of qubits.

* * * * *